(12) United States Patent
Oshima

(10) Patent No.: US 7,348,278 B2
(45) Date of Patent: Mar. 25, 2008

(54) METHOD OF MAKING NITRIDE-BASED COMPOUND SEMICONDUCTOR CRYSTAL AND SUBSTRATE

(75) Inventor: Yuichi Oshima, Tsuchiura (JP)

(73) Assignee: Hitachi Cable, Ltd., Tokyo (JP)

( * ) Notice: Subject to any disclaimer, the term of this patent is extended or adjusted under 35 U.S.C. 154(b) by 321 days.

(21) Appl. No.: 11/179,781

(22) Filed: Jul. 13, 2005

(65) Prior Publication Data

US 2006/0228819 A1 Oct. 12, 2006

(30) Foreign Application Priority Data

Apr. 11, 2005 (JP) ............................. 2005-113589

(51) Int. Cl.
*H01L 21/461* (2006.01)
(52) U.S. Cl. ............................. 438/698; 257/E21.267
(58) Field of Classification Search ................ 428/478; 438/698; 257/E21.267
See application file for complete search history.

(56) References Cited

U.S. PATENT DOCUMENTS 6,770,135 B2 * 8/2004 Schowalter et al. ........ 117/106

7,009,215 B2 * 3/2006 D'Evelyn et al. ............. 257/98
2002/0197825 A1 12/2002 Usui et al.
2003/0017685 A1 1/2003 Usui et al.

FOREIGN PATENT DOCUMENTS

JP 2002-343728 A 11/2002
JP 2003-178984 A 6/2003

* cited by examiner

*Primary Examiner*—Scott B. Geyer
*Assistant Examiner*—Elias Ullah
(74) *Attorney, Agent, or Firm*—Foley & Lardner LLP

(57) ABSTRACT

A method of making a nitride-based compound semiconductor crystal has the step of growing a nitride-based compound semiconductor crystal with a predetermined thickness by using a nitride-based compound semiconductor substrate as a seed crystal. The nitride-based compound semiconductor substrate as the seed crystal is polished at both surfaces thereof.

13 Claims, 1 Drawing Sheet

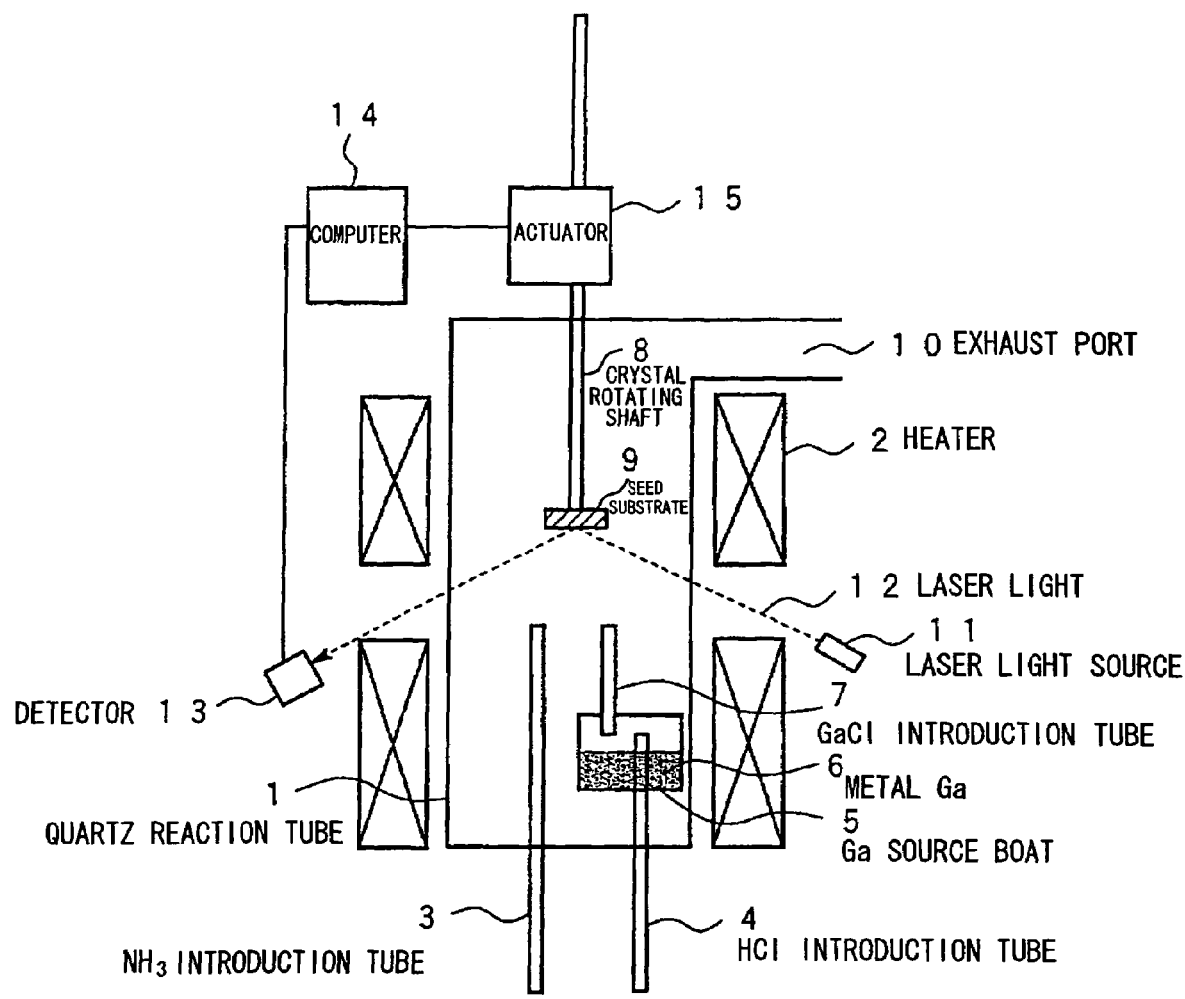

METHOD OF MAKING NITRIDE-BASED COMPOUND SEMICONDUCTOR CRYSTAL AND SUBSTRATE

The present application is based on Japanese patent application No. 2005-113589, the entire contents of which are incorporated herein by reference.

BACKGROUND OF THE INVENTION

1. Field of the Invention

This invention relates to a method of making a nitride-based compound semiconductor crystal and method of making a nitride-based compound semiconductor substrate.

2. Description of the Related Art

Nitride-based compound semiconductors such as GaN have a wide bandgap and are of direct transition type and, therefore, they attract attention for a material to emit ultraviolet to blue light.

In fabricating a light emitting device of nitride-based compound semiconductor, hetero-substrates such as sapphire have been used. However, the hetero-substrates have problems that a high dislocation density is generated in the hetero-epitaxial growth and the device fabrication thereof is complicated.

To solve the problems, self-standing substrates of nitride-based compound semiconductor are actively developed. A typical example thereof is a method that a GaN thick film is grown on a hetero-substrate such as sapphire by HVPE (hydride vapor phase epitaxy) and then the hetero-substrate is removed to obtain a self-standing substrate (e.g., JP-A-2003-178984). In this method, a void-containing layer functions as a strain buffering layer so as to buffer a strain caused by a difference in lattice constant or thermal expansion coefficient between the underlying substrate and the group III nitride-based compound semiconductor layer grown thereon. By the method, a substrate of group III nitride-based compound semiconductor can be obtained which offers a reduced defect density and a good crystalline quality without warping. Further, the self-standing substrate thus obtained can be easily separated. Based on the method, GaN substrates with a reduced dislocation have begun to be commercially available.

Another method for obtaining the self-standing substrate is also proposed. In this method, a metal thin film of Ti etc. with a catalytic activity to promote the decomposition of GaN is formed on the surface of a GaN underlying layer, and then it is thermally treated in $NH_3$ containing atmosphere to form a mesh-like TiN layer on the GaN layer and to generate an inverted cone-shaped void corresponding to the mesh space in the GaN underlying layer. Then, GaN is laterally grown on the TiN layer, and a GaN layer thus grown is separated by using solution of fluorinated acid and nitric acid. Thus, a self-standing substrate can be obtained with a reduced dislocation density as low as $10^7$ cm$^{-2}$ and without warping (e.g., JP-A-2002-343728).

However, the GaN substrate made by HVPE has a problem that it is very costly. Therefore, it is little available in the market. The high cost is mainly caused by that each of the GaN substrate needs multiple steps in growth thereof. In general, the growth steps include the hetero-growth on a hetero-substrate such as sapphire and GaAs. Therefore, the underlying substrate needs to be carefully prepared so as to prevent the generation of dislocation during the GaN crystal growth.

For example, the preparation of the underlying substrate is conducted such that a GaN thin layer of about 1 μm in thickness is formed on a sapphire substrate by MOVPE (metalorganic vapor phase epitaxy), a stripe mask of $SiO_2$ with a width of a few micrometers is formed thereon by fine photolithography, and a GaN thick film of about 500 μm in thickness is formed by HVPE on the underlying substrate. Then, the GaN thick film is separated from the sapphire substrate by laser separation method etc. Then, by polishing both faces of the film, a GaN substrate can be made at last. Thus, the steps are repeated in making each of the GaN substrate.

Since it is thus made through the multiple steps, the product yield of the GaN substrate is very low. Especially, there are problems in the step of growing the GaN underlying layer and forming the mask, and in the step of removing the hetero-substrate.

SUMMARY OF THE INVENTION

It is an object of the invention to provide a method of making a nitride-based compound semiconductor crystal and substrate that has a significantly high crystalline quality.

The invention is featured in that a GaN single crystal with less crystal defect and warping is used as a seed crystal, and vapor growth is started therefrom to have a large and high-quality GaN single crystal.

(1) According to one aspect of the invention, a method of making a nitride-based compound semiconductor crystal comprises:

growing a nitride-based compound semiconductor crystal with a predetermined thickness by using a nitride-based compound semiconductor substrate as a seed crystal, wherein said nitride-based compound semiconductor substrate as the seed crystal is polished at both surfaces thereof.

(i) It is preferred that said nitride-based compound semiconductor substrate as the seed crystal has a threading dislocation density of $1 \times 10^7$ cm$^{-2}$ or less.

(ii) It is preferred that said nitride-based compound semiconductor substrate as the seed crystal has a dispersion in crystal axis of 0.5 degrees or less.

(iii) It is preferred that said nitride-based compound semiconductor substrate as the seed crystal is mechanically remedied in warp.

(iv) It is preferred that said nitride-based compound semiconductor substrate as the seed crystal has a residual stress of 100 MPa or less.

(v) It is preferred that said grown nitride-based compound semiconductor crystal comprises a diameter greater than the seed crystal.

(vi) It is preferred that said grown nitride-based compound semiconductor crystal comprises a diameter two times or more greater than the seed crystal.

(vii) It is preferred that said growing of the nitride-based compound semiconductor crystal is conducted by a vapor-phase growth method.

(viii) It is preferred that said growing of the nitride-based compound semiconductor crystal is conducted by HVPE.

(ix) It is preferred that said grown nitride-based compound semiconductor crystal is kept at a same position in growth surface thereof by drawing back said nitride-based compound semiconductor crystal at the same speed as a growth speed of said nitride-based compound semiconductor crystal.

(x) It is preferred that said growth speed of said nitride-based compound semiconductor crystal is 350 μm/h or more.

(2) According to another aspect of the invention, a method of making a nitride-based compound semiconductor substrate comprises:
   growing a nitride-based compound semiconductor crystal with a predetermined thickness by using a nitride-based compound semiconductor substrate as a seed crystal; and
   slicing said grown nitride-based compound semiconductor crystal,
   wherein said nitride-based compound semiconductor substrate as the seed crystal is polished at both surfaces thereof.
(3) According to another aspect of the invention, a method of making a nitride-based compound semiconductor substrate comprises:
   growing a nitride-based compound semiconductor crystal with a predetermined thickness by using a nitride-based compound semiconductor substrate as a seed crystal;
   forming said grown nitride-based compound semiconductor crystal into a cylindrical column;
   forming an orientation flat on said formed nitride-based compound semiconductor crystal; and
   slicing said grown nitride-based compound semiconductor crystal,
   wherein said nitride-based compound semiconductor substrate as the seed crystal is polished at both surfaces thereof.
   (xi) It is preferred that said orientation flat comprises two or more orientation flats.

<Solutions of the Invention>

In order to solve the problems described earlier, a method is effective that, by using a GaN single crystal substrate obtained as described above as a seed crystal, a large ingot is grown at a high speed for long hours and is sliced to get a target GaN substrate.

In the method, the complicated steps of preparing the underlying-substrate and separating the hetero-substrate can be omitted. Thus, the product yield and manufacturing cost of the target GaN substrate can be significantly improved. Further, the nitride-based compound semiconductor substrate (herein also referred to as seed substrate) used as the seed crystal can be a GaN substrate made by using the conventional HVPE.

However, even if the GaN substrate made by the conventional HVPE is used as grown, the growth of ingot will be not succeeded. This is because, as the crystal grows, a number of cracks are generated during or after the growth to significantly reduce the crystalline quality (Reason 1). The causes presumed by the inventor are as follows.

(a) Internal Stress of the Seed Substrate

Since the seed substrate is grown hetero-epitaxially on the hetero-substrate, a number of dislocations are generated at the growth initiating interface where the crystal starts growing. The dislocation repeatedly merges and disappears during the growth of the seed substrate, and it is significantly reduced on the surface as compared to the growth initiating interface. Thus, since a distribution of dislocation is generated inside the seed substrate, the seed substrate must have a large internal stress. This is the reason why a number of cracks are generated in growing the thick GaN on the seed substrate.

(b) Warping of the Seed Substrate

Due to the internal stress described above, the GaN substrate is in general warped in the form of a concave while having the Ga polarity face on the surface side. Further, sine the growth speed is not perfectly uniform in the plane of the substrate, a normal line on the surface of the crystal does not always coincide with the c-axis. If such a crystal is used as the seed substrate, the internal stress may increase as the growth progresses, and result in generation of cracks.

As another reason for failing in ingot growth other than the above reasons on the seed substrate is presumed a change in growth conditions during growth (Reason 2). Namely, when crystal is grown very thick, the position of growth surface is moved in a growth furnace as time progresses. Along with this, the concentration of the source gases or growth temperature changes, which may cause deterioration in crystalline quality. Since a large crystal can change the flow of source gas, the change of growth conditions may be accelerated.

Based on the above presumptions, the inventor has invented the next solutions to solve the above problems.

At first, the seed substrate is to be polished at both faces thereof to remove a warp on the surface, to remove a high dislocation density layer near the back side, and to reduce internal stress (as described in (1)). It is desirable that residual stress is 100 MPa or less (as described in (iv)). Further, since inclination of crystal axis cannot be removed even when the surface is flattened by polishing, dispersion in crystal axis needs to be ±0.5 degrees or less (as described in (ii)). Alternatively, the seed substrate may be used after its warp is mechanically remedied (as described in (iii)). When dislocation density near the surface is $1\times10^7$ cm$^{-2}$ or more, a gradient in dislocation density may be generated again in growing a crystal thereon to cause an internal stress. Therefore, the seed substrate needs to have a threading dislocation density of $1\times10^7$ cm$^{-2}$ or less (as described in (i))

Further, it is desirable that a compensation control is conducted to draw back the crystal rotating shaft according to the growth speed to keep the growth surface in the furnace at the same position such that a change in growth conditions inside the furnace due to growth of thick GaN can be compensated (as described in (ix)). This compensation control can be easily performed by, for example, providing an optical detector to detect the growth surface position and an actuator controlled by a computer.

In addition to the use of the seed crystal and the growth apparatus, when an ingot is grown, it is desirable that grown crystal has an increased diameter twice or more greater than the seed crystal (as described in (v), (vi)). Thereby, the crystalline quality can be further enhanced. Further, the growth speed is to be 350 μm/h or more to prevent the contamination of impurity to get a high-quality crystal (as described in (x)).

A grown ingot is to be sliced to get a nitride-based compound semiconductor substrate (as described in (2)). It is desirable that an orientation flat is formed before the slicing (as described in (3)). Thereby, the manufacturing cost can be significantly reduced as compared to a conventional case that each of substrates is individually processed. Further, if necessary, two or more orientation flats may be formed to identify a side of the substrate (as described in (xi)).

BRIEF DESCRIPTION OF THE DRAWINGS

The preferred embodiments according to the invention will be explained below referring to the drawing, wherein:

FIG. 1 is an illustrative diagram of a crystal growth apparatus for HVPE used to conduct a method of making a nitride-based compound semiconductor crystal and substrate in a preferred embodiment according to the invention.

DETAILED DESCRIPTION OF THE PREFERRED EMBODIMENTS

FIG. 1 shows a crystal growth apparatus (HVPE furnace) for HVPE used to conduct a method of making a nitride-based compound semiconductor crystal and substrate in the preferred embodiment according to the invention.

A quartz reaction tube 1 has an exhaust port 10 attached onto its top portion, and it is heated by a heater 2 disposed on its periphery. A GaN source boat 5 is disposed at a lower portion of the quartz reaction tube 1. Source gases are introduced through an NH$_3$ introduction tube 3, an HCl introduction tube 4 and a GaCl introduction tube 7. At an upper portion of the quartz reaction tube 1, a crystal rotating shaft 8 is suspended having a seed substrate 9 fixed to the lower end thereof and is operable to move up and down by an actuator 15.

A current position of a surface of GaN single crystal grown from the seed substrate 9 is monitored by emitting a laser light 12 from a laser light source 11 and detecting its reflected light by a detector 13. Thus, a detection signal of substrate growth surface position to be outputted from the detector 13 is read by a computer 14, which controls the actuator 15 to keep the crystal growth surface at the same position in the furnace according to a deviation from the desired position.

EXAMPLE 1

Example 1 of the invention will be explained below referring to FIG. 1.

At first, a GaN single crystal substrate with a diameter of 25 mm is prepared as a seed substrate by using the void formation separation method (which is disclosed in JP-A-2002-343728).

In detail, a GaN epitaxial substrate is prepared by growing a 500 nm thick undoped GaN layer on a sapphire C-face substrate with a diameter of 25 mm by MOVPE using trimethylgallium (TMG) and ammonium (NH$_3$).

Then, a Ti film is deposited 30 nm on the GaN epitaxial substrate, and it is introduced into an MOVPE furnace and thermally treated in mixed gas flow of H$_2$:80% and NH$_3$: 20% at 1050° C. for 30 min.

This substrate is temporarily taken out of the furnace to confirm by a microscope that a TiN film with microscopic holes is formed on the surface of the substrate, and then moved into the HVPE furnace to deposit a 500 µm thick GaN layer thereon. Materials used in the deposition are NH$_3$ and GaCl. The growth conditions are 1 atm (=1013.25 hPa), a substrate temperature of 1050° C., and a growth speed of 80 µm/h.

The GaN epitaxial substrate thus obtained is soaked in solution of hydrofluoric acid and nitric acid to separate the GaN layer deposited on the TiN film. Thus, a GaN self-standing substrate which corresponds to an original of the seed substrate described later is obtained.

The GaN self-standing substrate is mirror-polished at its both faces and, as a result, a seed substrate with a thickness of 430 µm is obtained.

As described above, the seed substrate is mirror-polished at both face thereof and has a thickness of 430 µm. Its main plane is c-face and a Ga polarity plane is on the surface side. When in-plane dispersion of c-axis is checked by X-ray diffraction, it has a good value of within ±0.1 degree. Meanwhile, another crystal made by the same method has a dislocation density as low as 4×10$^6$ cm$^{-2}$ which is checked by EPD.

This seed substrate is disposed in the HVPE furnace as shown in FIG. 1.

When HCl gas is flown through an HCl introduction tube 4 into the Ga source boat 5 disposed in the quartz reaction tube 1 being heated by the heater 2, it is reacted with metal Ga 6 to generate GaCl. GaCl generated is supplied through a GaCl introduction tube 7 to the seed substrate 9 fixed to the crystal rotating shaft 8. NH$_3$ is separately from GaCl supplied through the NH$_3$ introduction tube 3 to the seed substrate 9. GaCl is reacted with NH$_3$ on the seed substrate 9 and the GaN single crystal is thus grown thereon. During the growth, laser light 12 emitted from the laser light source 11 and then reflected on the crystal growth surface is detected by the detector 13 to continuously monitor the substrate growth surface position. The detection signal is read out by the computer 14, which controls the actuator 15 to keep the substrate growth surface position at the same level in the furnace. By using the HVPE apparatus, the crystal growth on the seed substrate 9 is conducted at a growth speed of 400 µm/h for 100 hours.

Thereby, a 40 mm long ingot is obtained. During the growth, the diameter of crystal is increased to 60 mm at the midway portion. The portion with the increased diameter to 60 mm is about 25 mm of the 40 mm length.

The ingot is ground into a cylindrical column. Although some polycrystal is found on the periphery, a transparent single crystal ingot with no crack can be obtained by grinding into the cylindrical column to have a diameter of 50 mm.

The position of (1-100) face is determined by X-ray diffraction, and a 15 mm long orientation flat is thereby formed. In order to identify a side of the substrate after slicing, a 10 mm long second orientation flat is formed at a position rotated by 90 degrees. Then, it is sliced by a wire saw to have 40 GaN substrates with a thickness of 500 µm. Each of the substrates is mirror-polished at both faces thereof to get a transparent GaN single crystal substrate with a diameter of 50 mm.

In the GaN substrate thus obtained, the FWHM (full width at half maximum) value of X-ray rocking curve is 30 sec. for (0002) reflection and 60 sec. for (10-10) reflection. The dislocation density measured by EPD is 3×10$^5$ cm$^{-2}$. In view of these results, it is proved that a high-quality GaN substrate is obtained.

EXAMPLE 2

At first, a GaN single crystal substrate with a diameter of 25 mm is prepared as a seed substrate by using the void formation separation method (which is disclosed in JP-A-2002-343728). The preparation is conducted in the same method as Example 1.

Namely, a GaN epitaxial substrate is prepared by growing a 500 nm thick undoped GaN layer on a sapphire C-face substrate with a diameter of 25 mm by MOVPE.

Then, a Ti film is deposited 30 nm on the GaN epitaxial substrate, and it is introduced into an MOVPE furnace and thermally treated at 1050° C. for 30 min.

This substrate is temporarily taken out of the furnace to confirm by a microscope that a TiN film with microscopic holes is formed on the surface of the substrate, and then moved into the HVPE furnace to deposit a 500 µm thick GaN layer thereon.

The GaN epitaxial substrate thus obtained is soaked in solution of hydrofluoric acid and nitric acid to separate the GaN layer deposited on the TiN film. Thus, a GaN self-standing substrate is obtained.

The GaN self-standing substrate is mirror-polished at its both faces and, as a result, a seed substrate with a thickness of 430 μm is obtained.

As described above, the seed substrate is mirror-polished at both face thereof and has a thickness of 430 μm. Its main plane is c-face and a Ga polarity plane is on the surface side.

This seed substrate is warped in the form of a concave. When in-plane dispersion of c-axis is checked by X-ray diffraction, it has a large value of within ±0.3 degrees. Meanwhile, another crystal made by the same method has a dislocation density as low as $4 \times 10^6$ cm$^{-2}$ which is checked by EPD.

This seed substrate is disposed in the HVPE furnace as shown in FIG. 1. However, a ring-shaped jig is used to remedy the warping of the seed substrate before the seed substrate is disposed therein.

Thus, by conducting the same growth as Example 1, a 40 mm long ingot is obtained. By processing it, 40 GaN substrates are obtained.

In the GaN substrate thus obtained, the FWHM (full width at half maximum) value of X-ray rocking curve is 30 sec. for (0002) reflection and 60 sec. for (10-10) reflection. The dislocation density measured by EPD is $3 \times 10^5$ cm$^{-2}$. In view of these results, it is proved that a high-quality GaN substrate is obtained.

COMPARATIVE EXAMPLE

At first, a thick GaN crystal grown as a seed crystal on a sapphire substrate by HVPE is separated by laser beam irradiation to have a GaN single crystal with a diameter of 25 mm. This seed substrate is as grown with a thickness of 300 μm. Its main plane is c-face and a Ga polarity plane is on the surface side. When in-plane dispersion of c-axis is checked by X-ray diffraction, it has a large value of within ±0.7 degrees. Meanwhile, another crystal made by the same method has a relatively high dislocation density of $4 \times 10^7$ cm$^{-2}$ which is checked by EPD.

This seed substrate is disposed in the HVPE furnace as shown in FIG. 1. Then, crystal growth is conducted at 100 μm/h for 100 hours. In this case, the control of substrate position is not conducted, different from Examples 1 and 2, and the crystal growth is conducted keeping the substrate position fixed. Thus, a 10 mm long ingot is obtained. Different from Examples 1 and 2, enlargement of the diameter is not conducted.

The ingot thus obtained is ground into a cylindrical column with a diameter of 20 mm. Although a transparent single crystal ingot is obtained thereby, it is found that it has high-density cracks inside thereof. Then, it is sliced by a wire saw to have 15 GaN substrates with a thickness of 500 μm. Each of the substrates is mirror-polished at both faces thereof to get a GaN single crystal substrate with a diameter of 20 mm.

In the GaN substrate thus obtained, the FWHM (full width at half maximum) value of X-ray rocking curve is 120 sec. for (0002) reflection and 200 sec. for (10-10) reflection. Due to the crack, multiple peaks are partially observed. The dislocation density measured by EPD is $8 \times 10^7$ cm$^{-2}$. In view of these results, it is proved that the crystalline quality deteriorates apparently.

Although in the above embodiments the invention is applied to a method of making a GaN substrate, the invention can be also applied to a method of making a self-standing substrate of a ternary single crystal such as aluminum gallium nitride (AlGaN) and gallium indium nitride (GaInN) or a method of making a p-type GaN substrate doped with Mg etc.

Although in the above embodiments the HVPE, one of vapor-phase growth method, is used to grow the nitride-based compound semiconductor crystal on the seed substrate, another method such as a sublimation method can be used.

When the crystal made by the method of the invention is repeatedly used as a seed substrate, a crystal can be obtained with a higher crystalline quality.

The group III nitride-based compound semiconductor substrate obtained by the invention can be widely used as a substrate for GaN-based devices. Especially, when it is used as a substrate for a laser diode, the laser diode can have a high performance and a high reliability since a good GaN-based crystal can be formed thereon with a reduced crystal defect.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. A method of making a nitride-based compound semiconductor crystal, comprising:
    growing a nitride-based compound semiconductor crystal with a predetermined thickness by using a nitride-based compound semiconductor substrate as a seed crystal,
    wherein said nitride-based compound semiconductor substrate as the seed crystal is polished at both surfaces thereof; and
    wherein said nitride-based compound semiconductor substrate as the seed crystal has a dispersion in crystal axis of 0.5 degrees or less.

2. The method according to claim 1, wherein:
    said nitride-based compound semiconductor substrate as the seed crystal has a threading dislocation density of $1 \times 10^7$ cm$^{-2}$ or less.

3. The method according to claim 1, wherein:
    said nitride-based compound semiconductor substrate as the seed crystal is mechanically remedied in warp.

4. The method according to claim 1, wherein:
    said nitride-based compound semiconductor substrate as the seed crystal has a residual stress of 100 MPa or less.

5. The method according to claim 1, wherein:
    said grown nitride-based compound semiconductor crystal comprises a diameter greater than the seed crystal.

6. The method according to claim 1, wherein:
    said grown nitride-based compound semiconductor crystal comprises a diameter two times or more greater than the seed crystal.

7. The method according to claim 1, wherein:
    said growing of the nitride-based compound semiconductor crystal is conducted by a vapor-phase growth method.

8. The method according to claim 1, wherein:
    said growing of the nitride-based compound semiconductor crystal is conducted by HVPE.

9. The method according to claim 1, wherein:
    said grown nitride-based compound semiconductor crystal is kept at a same position in growth surface thereof by drawing back said nitride-based compound semiconductor crystal at a same speed as a growth speed of said nitride-based compound semiconductor crystal.

10. The method according to claim 9, wherein:

said growth speed of said nitride-based compound semiconductor crystal is 350 μm/h or more.

11. A method of making a nitride-based compound semiconductor substrate, comprising:

growing a nitride-based compound semiconductor crystal with a predetermined thickness by using a nitride-based compound semiconductor substrate as a seed crystal; and slicing said grown nitride-based compound semiconductor crystal, wherein said nitride-based compound semiconductor substrate as the seed crystal is polished at both surfaces thereof; and wherein said nitride-based compound semiconductor substrate as the seed crystal has a dispersion in crystal axis of 0.5 degrees or less.

12. A method of making a nitride-based compound semiconductor substrate, comprising:

growing a nitride-based compound semiconductor crystal with a predetermined thickness by using a nitride-based compound semiconductor substrate as a seed crystal;

forming said grown nitride-based compound semiconductor crystal into a cylindrical column;

forming an orientation flat on said formed nitride-based compound semiconductor crystal; and slicing said grown nitride-based compound semiconductor crystal, wherein said nitride-based compound semiconductor substrate as the seed crystal is polished at both surfaces thereof; and wherein said nitride-based compound semiconductor substrate as the seed crystal has a dispersion in crystal axis of 0.5 degrees or less.

13. The method according to claim 12, wherein:

said orientation flat comprises two or more orientation flats.

* * * * *